(12) United States Patent
Mullenix et al.

(10) Patent No.: US 10,396,016 B2
(45) Date of Patent: Aug. 27, 2019

(54) LEADFRAME INDUCTOR

(71) Applicant: TEXAS INSTRUMENTS INCORPORATED, Dallas, TX (US)

(72) Inventors: Joyce Marie Mullenix, San Jose, CA (US); Roberto Giampiero Massolini, Pavia (IT); Kristen Nguyen Parrish, Dallas, TX (US); Osvalod Jorge Lopez, Annadale, NJ (US); Jonathan Almeria Noquil, Bethlehem, PA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/395,429

(22) Filed: Dec. 30, 2016

(65) Prior Publication Data

US 2018/0190573 A1    Jul. 5, 2018

(51) Int. Cl.
| | |
|---|---|
| *H01L 23/495* | (2006.01) |
| *H01L 21/48* | (2006.01) |
| *H01L 23/552* | (2006.01) |
| *H01L 23/64* | (2006.01) |

(52) U.S. Cl.
CPC .... *H01L 23/49541* (2013.01); *H01L 21/4825* (2013.01); *H01L 23/495* (2013.01); *H01L 23/49517* (2013.01); *H01L 23/552* (2013.01); *H01L 23/645* (2013.01); *H01L 2224/40245* (2013.01)

(58) Field of Classification Search
CPC ............. H01L 23/495; H01L 23/49541; H01L 23/49517; H01L 23/552; H01L 23/645; H01L 21/4825; H01F 27/027; H01F 27/29; H01F 27/292; H01F 27/245; H01F 27/2804
See application file for complete search history.

(56) References Cited

U.S. PATENT DOCUMENTS

| | | | |
|---|---|---|---|
| 6,621,140 B1 | 9/2003 | Gibson et al. | |
| 6,765,284 B2 | 7/2004 | Gibson et al. | |
| 6,982,479 B2 | 1/2006 | Nishijima et al. | |
| 7,688,172 B2 * | 3/2010 | Lotfi | H01F 17/04 336/192 |
| 2007/0256759 A1 * | 11/2007 | Matsukawa | H01F 1/26 148/101 |
| 2009/0045905 A1 * | 2/2009 | Nakagawa | H01F 1/26 336/232 |
| 2010/0033288 A1 * | 2/2010 | Yokoyama | H01F 17/0013 336/200 |
| 2010/0277267 A1 * | 11/2010 | Bogert | H01F 3/10 336/221 |
| 2010/0314728 A1 | 12/2010 | Li | |
| 2013/0249051 A1 * | 9/2013 | Saye | H01L 23/49568 257/528 |
| 2016/0113144 A1 * | 4/2016 | Ye | H05K 3/284 361/709 |

* cited by examiner

*Primary Examiner* — Syed I Gheyas
(74) *Attorney, Agent, or Firm* — Dawn Jos; Charles A. Brill; Frank D. Cimino

(57) ABSTRACT

One example includes a device that is comprised of a die, a leadframe, and an electrically conductive material. The die includes a circuit therein. The leadframe is coupled with the die and the circuit therein. The electrically conductive material is disposed in a space above the die opposite the leadframe, the electrically conductive material being coupled to the leadframe and configured as one or more turns thereof to form at least one inductor.

19 Claims, 5 Drawing Sheets

US 10,396,016 B2

LEADFRAME INDUCTOR

TECHNICAL FIELD

This disclosure relates generally to an inductor and, more particularly to an inductor that is formed from a leadframe.

BACKGROUND

An inductor, also called a coil or reactor, is a passive two-terminal electrical component which resists changes in electric current passing through it. It consists of a conductor such as a wire, typically wound into a coil. Energy is stored in a magnetic field in the coil as current flows. When the current flowing through an inductor changes, the time-varying magnetic field induces a voltage in the conductor, according to Faraday's law of electromagnetic induction. According to Lenz's law, the direction of induced electromotive force (EMF) opposes the change in current that created it. Many inductors have a magnetic core made of iron or ferrite inside the coil, which serves to increase the magnetic field and thus the inductance.

SUMMARY

One example includes a device that includes a die, a leadframe, and an electrically conductive material. The die includes a circuit therein. The leadframe is coupled with the die and the circuit therein. The electrically conductive material is disposed in a space above the die opposite the leadframe, the electrically conductive material being coupled to the leadframe and configured as one or more turns thereof to form at least one inductor.

Another example provides a method that includes coupling a leadframe with a die including a circuit therein. The method also includes disposing an electrically conductive material in a space above the die opposite the leadframe. The method also includes electrically coupling the electrically conductive material to the leadframe configured as one or more turns thereof to form at least one inductor.

Another example provides a device that includes a die, a leadframe, an electrically conductive material, and a layer of magnetic material. The die includes a circuit therein. The leadframe is coupled with the die and the circuit therein. The electrically conductive material is disposed in a space above the die opposite the leadframe, the electrically conductive material being coupled to the leadframe and configured as one or more turns thereof to form at least one inductor. The layer of magnetic material is disposed between the die and the electrically conductive material.

DETAILED DESCRIPTION

This disclosure relates generally to an inductor and, more particularly to a leadframe inductor. For example, a device is disclosed, such as an integrated circuit package, which includes an inductor in a space above a die that includes a circuit therein. A leadframe that is comprised of an electrically conductive material is used to form the inductor. In an example, the device may further include addition of a magnetic material for shielding and to enhance performance of the inductor increasing an inductance value for a same area or volume, thereby improving inductance density of the inductor. The leadframe inductor provides thick metallization to form an inductor with high current capability for co-packaging with the die such as for power applications. The leadframe inductor has low direct current resistance (DCR), high efficiency, and high saturation current. Using a magnetic material with the leadframe inductor (e.g., between the inductor and die) reduces electromagnetic interference (EMI) radiated noise both in the near field and the far field and reduces eddy current in the die, allowing the leadframe inductor to be applied to three dimension stacking on top of highly doped silicon substrates. The use of the space above the die to form a low-profile inductor is suitable for package integration. Such a device can be created using existing packaging technology, for example. Moreover, such features allow a circuit that incorporates the device to consume a smaller area than approaches in which an inductor is placed laterally with respect to the die.

Figure 1:
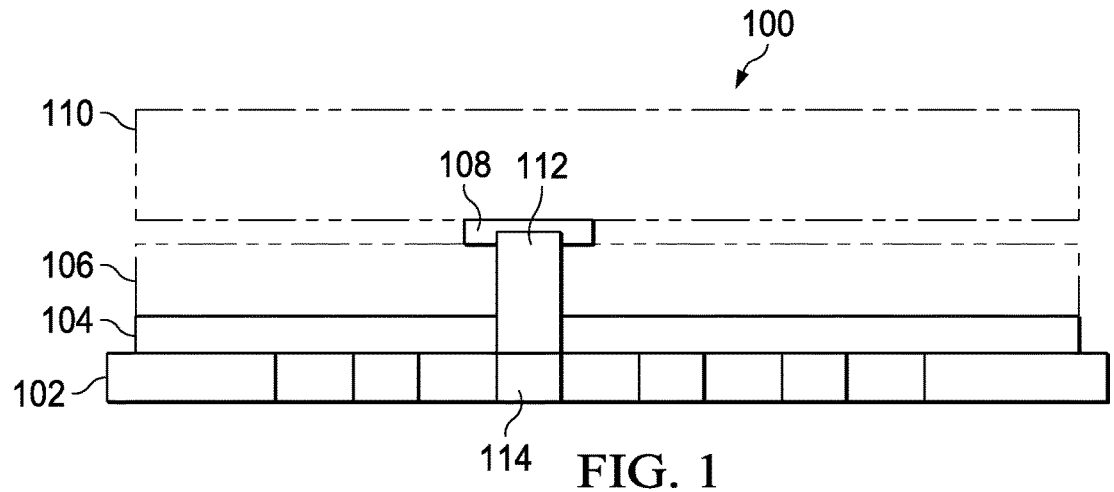
FIG. 1 illustrates an example of a device that includes an inductor in a space above a die.

FIG. 1 illustrates an example of a device 100 that includes an inductor in a space above a die 104. In an example, the device 100 includes the die 104, such as a die formed from silicon substrate, and the die is fabricated to include circuitry therein. In integrated circuits, the die 104 is a small block of semiconducting material, on which one or more functional circuits are fabricated. Typically, integrated circuits are produced in large batches on a single wafer of electronic grade silicon (EGS) or other semiconductor, such as GaAs, through processes such as include photolithography. This wafer is cut ("diced") into many pieces, each containing one copy of the circuit on each respective die 104.

The die 104 is electrically coupled to a leadframe 102 that includes a plurality of leads on the outer edges thereof. In an example, the die 104 is flip-chip coupled to the leadframe 102. In another example, the die 104 is glued to the leadframe 102. The leadframe 102 is a metal structure inside a chip package that carries signals from the die 104 to components outside the die 104. In a later stage of a manufacturing process, the leadframe 102 is typically overmolded in a case, for example plastic or other material, to form an integrated circuit package, and portions of the leadframe 102 outside of the integrated circuit package may be cut-off.

In a space overlying the die 104, electrically conductive material is configured to provide one or more turns (e.g., one or more windings) and thereby form an inductor. As an example, the electrically conductive material is in the form of a winding member 108 that is disposed in the vertical space above the die 104. For example, the winding member 108 may be in the form of a clip at least partially encompassing the die 104 and including one or more turns of the electrically conductive material, for example copper, which is coupled to the leadframe to electrically connect the inductor with the functional circuitry of the die. In an example, the winding member 108 is fixed (e.g., via an adhesive) to the top of a magnetic core 106, which is disposed over the die 104. In an example, the magnetic core 106 may be comprised of at least one of a ferrite plate, pressed metal powder, and a magnetic powder in an insulating binder, where the insulating binder is at least one of epoxy, resin, and plastic. The winding member 108 forms an inductor disposed in the vertical space above the die 104 opposite the leadframe 102.

As a further example, the winding member 108 may be a leadframe panel formed using a punch, with a bend therein being achieved by downset. Bending ends of the winding member 108 forms respective connectors 112. Each connector 112 may be soldered or otherwise connected to an associated lead 114 of the leadframe 102 to electrically couple to the leadframe 102. One winding member 108 is demonstrated for simplicity of explanation, however, in other examples, the device 100 may include a plurality of such winding members 108 constituting one or more inductors. The winding members 108 may be placed next to each other on a same plane, opposite the leadframe 102. In other examples, the winding members 108 may be placed in different layers in the vertical space above the die 104 opposite the leadframe 102.

In some examples, magnetic material (e.g., magnetic core) 106 is disposed in a vertical space above the silicone die 104 opposite the leadframe 102, such as interposed between the die and the winding member 108. In an example, the magnetic core 106 is fixed to the top of the die 104 opposite the die surface to which the leadframe 102 is affixed. In an example, the magnetic core 106 is fixed by adhesive, pick and place, extrusion of magnetic epoxy, via 3D printing, stencil placement, and/or by any other fixation technique that allows the magnetic core 106 to be fixed to the die 104. In an example, the magnetic core 106 is disposed on a bottom and top of the conductor 108. In another example, the magnetic core 106 completely surrounds the conductor 108 on the opposite side of the leadframe 102.

For example, the magnetic core 106 may be made of a layer of iron or ferrite, or other material showing permeability larger than one, which serves to confine the magnetic field, thereby reducing a length of magnetic path and increasing inductance of the inductor formed from the conductor 108. The magnetic core 106 also acts as a flux shield for flux produced by the inductor. The magnetic core 106 may be approximately a same width and length of the die 104 that the magnetic core 106 is disposed above. In another example, the magnetic core 106 is smaller than a width and/or length the die 104.

In the vertical space above the die 104, the device 100 may further include an optional magnetic material or magnetic layer 110 opposite the leadframe 102. This magnetic layer 110 is disposed above the winding member 108. In an example, the magnetic layer 110 is approximately equal to a width and length of the die 104. In another example, the magnetic layer 110 is smaller than a width and/or length of the die 104. The magnetic layer 110 may be fixed to the conductor 108. The magnetic layer 110 increases the inductance density of the winding member 108, while also providing shielding benefits to components proximate to the winding member 108. In an example, the magnetic layer 110 is fixed by adhesive, pick and place, extrusion of magnetic epoxy, via 3D printing, stencil placement, and/or by any other fixation technique that allows the magnetic layer 110 to be fixed to the conductor 108.

Figure 2A:
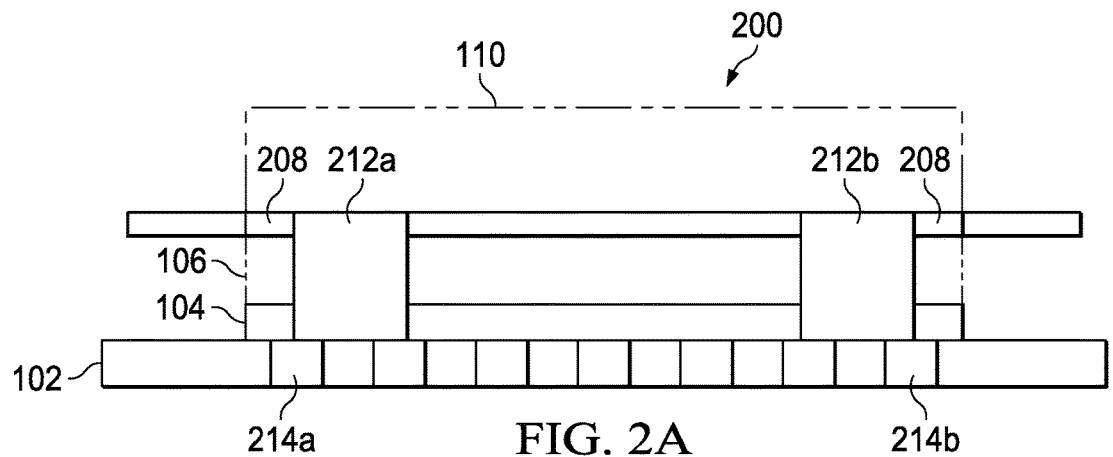
FIGS. 2A and 2B illustrate different views of another example device that includes an inductor in a space above the die.
Figure 2B:
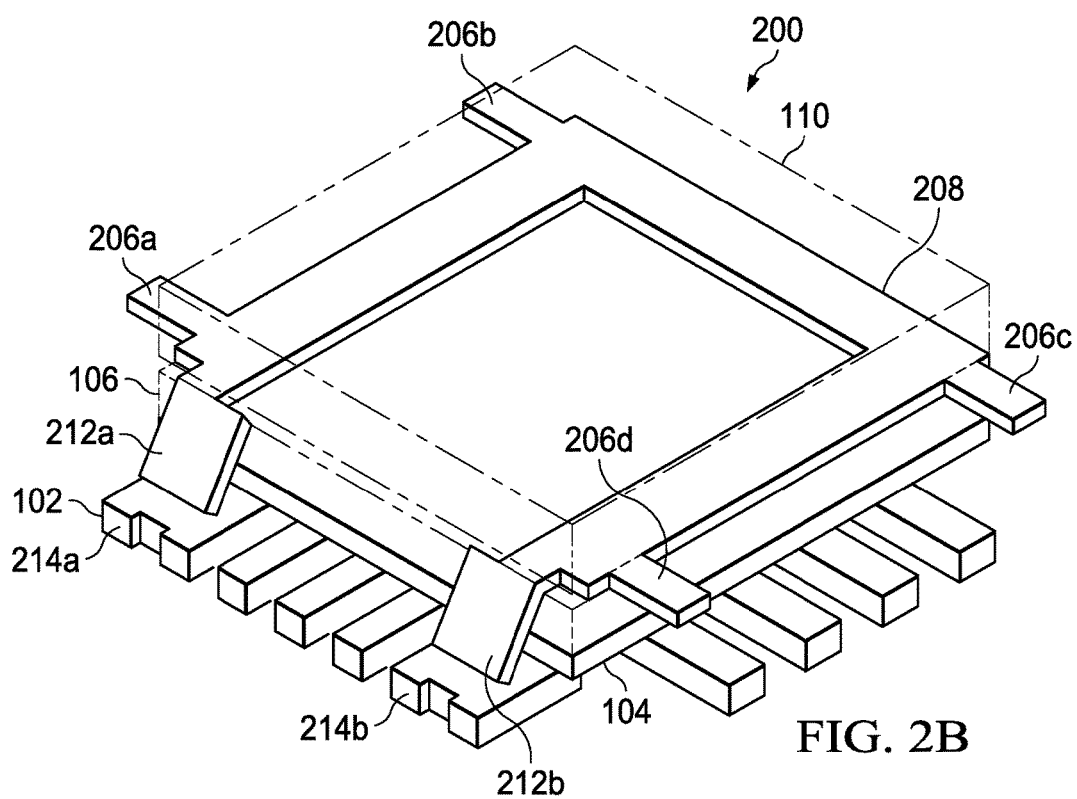

FIGS. 2A and 2B illustrate different views of another example device 200 that includes an inductor in a space above a die 104, such as integrated into an IC package. Thus, the various views of FIGS. 2A and 2B may be referred to for purposes for the following description in which the reference numbers refer to similar features in the various views. Additionally, features introduced with respect to FIG. 1 are referred to using the same reference numbers in FIGS. 2A and 2B.

In this example, a magnetic core 106 is disposed above the die 104 opposite the leadframe 102. A winding member 208 is disposed in the vertical space above the magnetic core 106 opposite the die 104. For example, the winding member 208 includes a single turn of electrically conductive material to form part of the inductor. The winding member 208 is disposed to extend along three sides of the die 104, forming a "U" shaped winding member 208, the outside edge of which lines up with and extends along the outside edge of the die 104. In another example, the "U" shaped winding member 208 may be smaller than the outside edge of the die 104. The conductive trace 208 may include leads 206a-d that are approximately to and extend away from each of the four corners of the winding member 208 that correspond to the four corners of the die 104. The winding member 208 is coupled to the leadframe 102 by the two spaced apart ends of the "U". For example, the two ends of the "U" shaped winding member 208 are bent by downset to form connectors 212a and 212b. These connectors 212a and 212b are then electrically coupled, for example by soldering, to the leadframe 102. The connectors 212a and 212b are coupled to leads 214a and 214b of the leadframe 102, respectfully, as to couple the inductor with circuitry of the die 104 via the leadframe. Another magnetic layer 110 may disposed in the vertical space above the winding member 208 opposite the magnetic core 106.

Figure 3A:
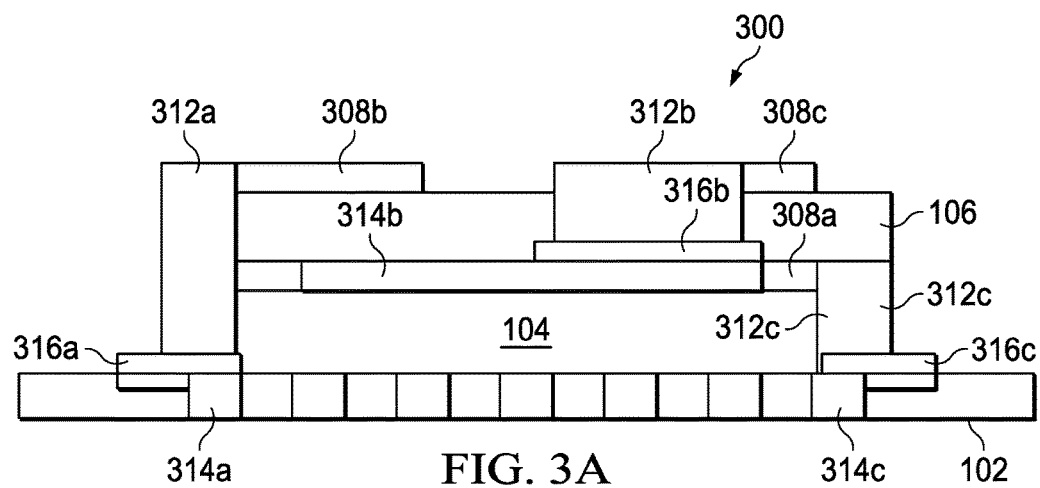
FIGS. 3A and 3B illustrate different views of another example device that includes an inductor in a space above the die.
Figure 3B:
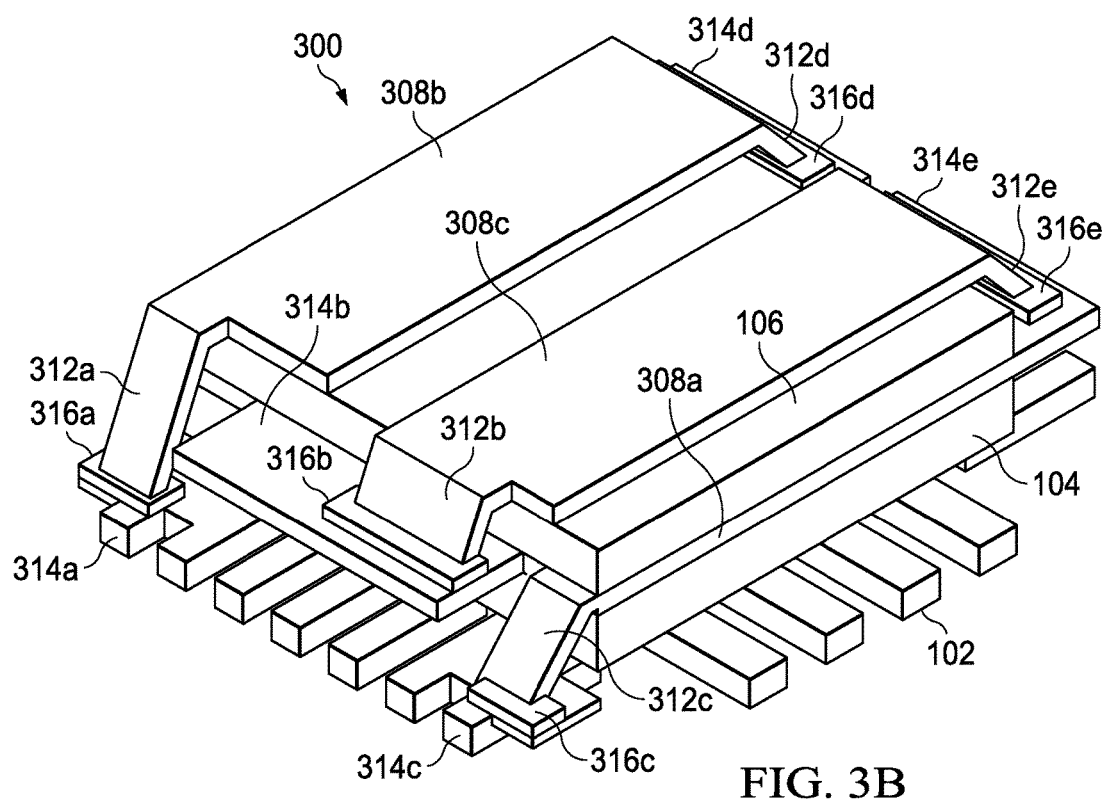

FIGS. 3A and 3B illustrate different views of another example device 300 that includes an inductor in a space above a die 104. Thus, the various views of FIGS. 3A and 3B may be referred to for purposes for the following description in which the reference numbers refer to similar features in the various views. Additionally, reference numbers introduced with respect to FIG. 1 are maintained through the description of FIGS. 3A and 3B to refer to corresponding features.

In this example, device 300 includes an inductor that is comprised of two members of electrically conductive material, such as copper, configured to provide one or more windings around a magnetic core 106. In an example, the inductor device 300 may be configured as a solenoid. The conductive layers may be formed as panel windings using a punch. In the example of FIGS. 3A and 3B, a second leadframe is comprised of a first winding member 308a that is coupled to and disposed in the vertical space above the die 104 opposite the leadframe 102. The first winding member 308a includes connector 312c that is deflected (e.g., bent) in a direction to couple to a lead 314c of the leadframe 102. A third leadframe includes a second member of the inductor that includes a second winding member 308b and a third winding member 308c. The second winding member 308b includes a connector 312a that deflects in the direction of the leadframe 102 to electrically couple the second winding member 308b to lead 314a of the leadframe 102 and a connector 312d that electrically couples the winding member 308b to the lead 314d of first winding member 308a. The third winding member 308c includes connector 312b that is bent to electrically couple the third winding member 308c to lead 314b of the first winding member 308a and another connector 312e that electrically couples to lead 314e of the first winding member 308a. In an example, the connectors 312a-e may be electrically coupled to the leads 314a-e via the connector pads 316a-e, respectively.

The first winding member 308a provides an electrically conductive path between lead 314c of the leadframe 102 where the connector 312c is electrically coupled to the leadframe 102 and the lead 314e of the first winding member 308a where the connector 312e is electrically coupled to the first winding member 308a. The first winding member 308a further provides an electrically conductive path between lead 314e where the connector 312e is electrically coupled to the first winding member 308a and lead 314b where the location where the connector 312b is electrically coupled to the first winding member 308a. Third winding member 308c provides an electrically conductive path between lead 314e of the first winding member 308a and the lead 314b of the first winding member 308a. Second winding member 308b provides an electrically conductive path between lead 314d of the first winding member 308a and the lead 314a of the leadframe 102. Thus, the member 308a, winding member 308b, and winding member 308c provide a winding conductive path that wraps around the magnetic core 106 as to form an inductor. Member 308a and winding member 308b form a winding electrically conductive path that wraps around the magnetic core 106, with first winding member 308a and third winding member 308c forming another winding electrically conductive path that wraps around the magnetic core 106.

The turns within the first winding member 308a, the first second winding member 308b, and the second third winding member 308c are configured with a width that reduces the resistance of the windings formed therewith. In the example illustrated in FIGS. 3A and 3B, the width of the first winding member 308a, the first second winding member 308b, and the second third winding member 308c are wider than the connectors 312a-d to reduce the resistance of the windings formed therewith. In another embodiment, the width of the winding members 308 is reduced and the number of winding members 308 is increased to increase a number of turns that form the inductor.

Figure 4A:
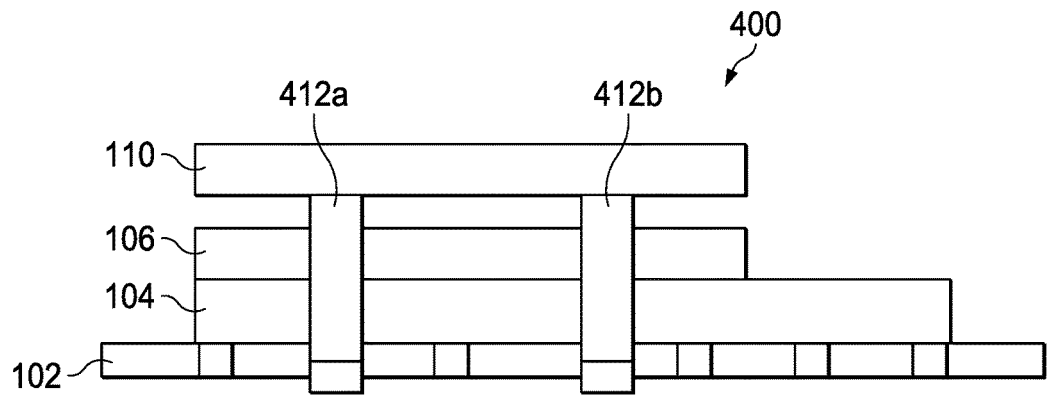
FIGS. 4A and 4B illustrate different views of another example device that includes an inductor in a space above the die.
Figure 4B:
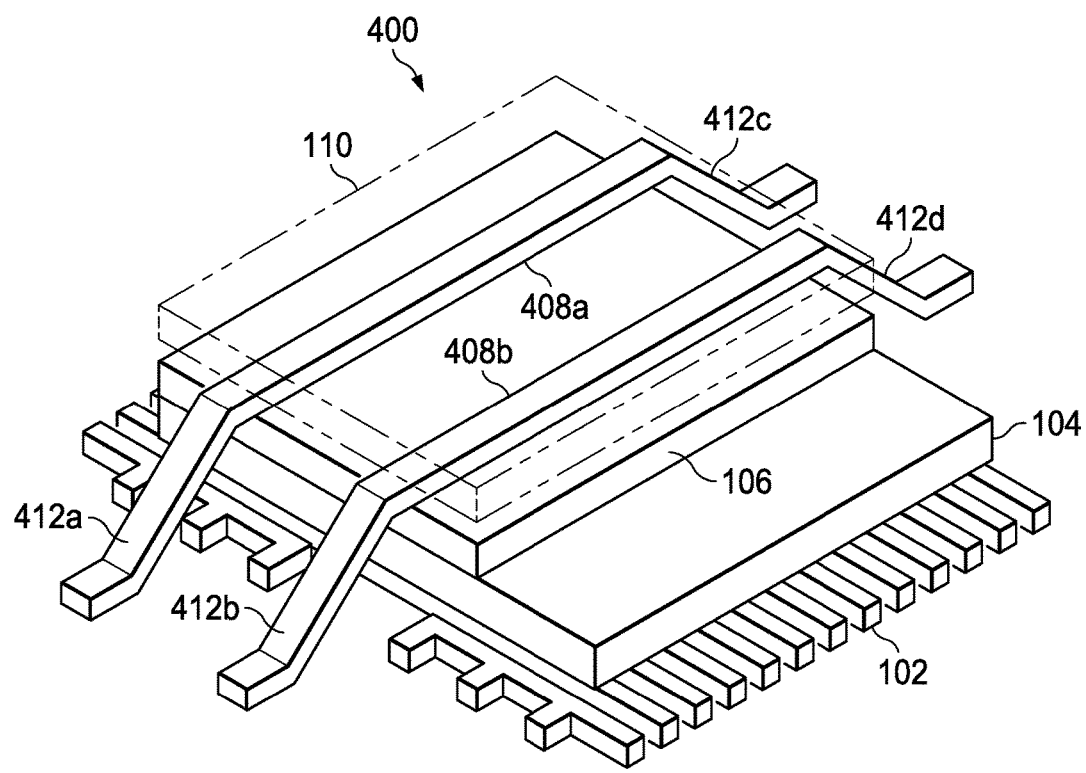

FIGS. 4A and 4B illustrate different views of another example device 400 that includes an inductor in a space above a die 104. Thus, the various views of FIGS. 3A and 3B may be referred to for purposes for the following description in which the reference numbers refer to similar features in the various views. Additionally, reference numbers introduced with respect to FIG. 1 are maintained through the description of FIGS. 4A and 4B to refer to corresponding features.

In this example, device 400 includes multiple inductors that are formed of electrically conductive material forming respective electrically winding members 408a and 408b, such as copper. The winding members 408a and 408b may be formed from a leadframe as panels in a layer of the conductive material using a punch, for example. The winding members 408s and 408b thus form single turns of two distinct inductors. The device 400 includes the magnetic core 106 coupled to and disposed in the vertical space above the die 104. The first winding member 408a and the second winding member 408b are disposed on the magnetic core 106 next to each other. In an example, the first winding member 408a and the second winding member 408b are positioned to extend approximately parallel to each other on the magnetic core layer 106. In this example, an end portion of the die 104 remains uncovered, without the magnetic core 106 and the magnetic layers 110 fully covering a surface of the die 104 opposite the leadframe 102.

The first winding member 408a includes connectors 412a and 412c at opposing ends of the first winding member 408a. The second winding member 408b connectors 412b and 412d that are configured to couple with the leadframe. In this example, the connectors 412a-d are illustrated prior to being electrically coupled to the leadframe 102. Thus, at this intermediate fabrication stage, the connectors 412a-d are longer than a length needed to be coupled to the leadframe 102. Thus, the connectors 412a-d are cut-off to an appropriate length to allow the connectors 412a-d to be electrically coupled to the leadframe 102.

Figure 5A:
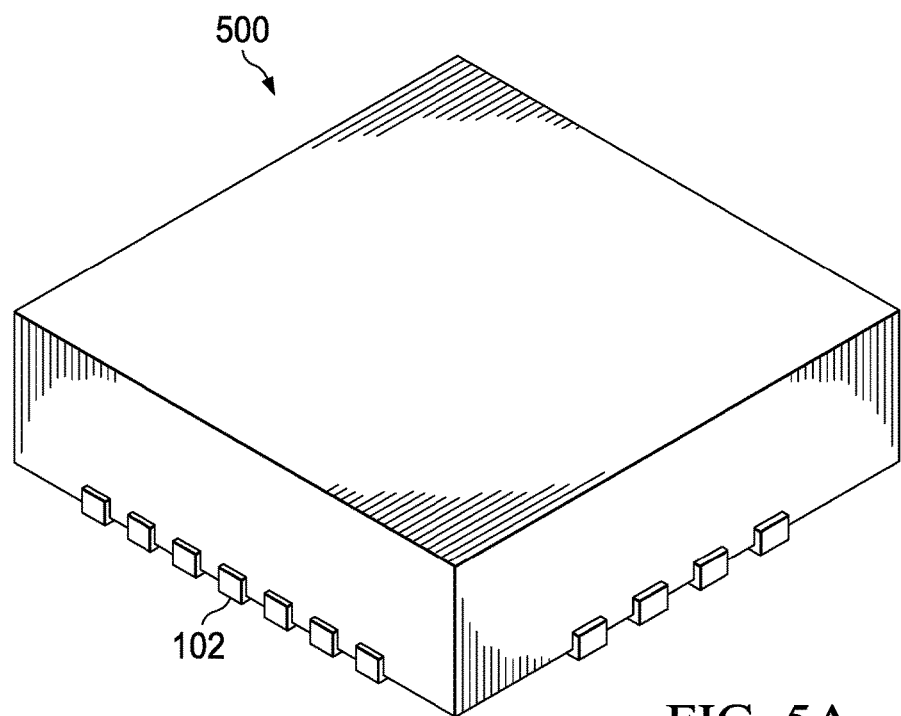
FIGS. 5A and 5B illustrate an example integrated circuit package.
Figure 5B:
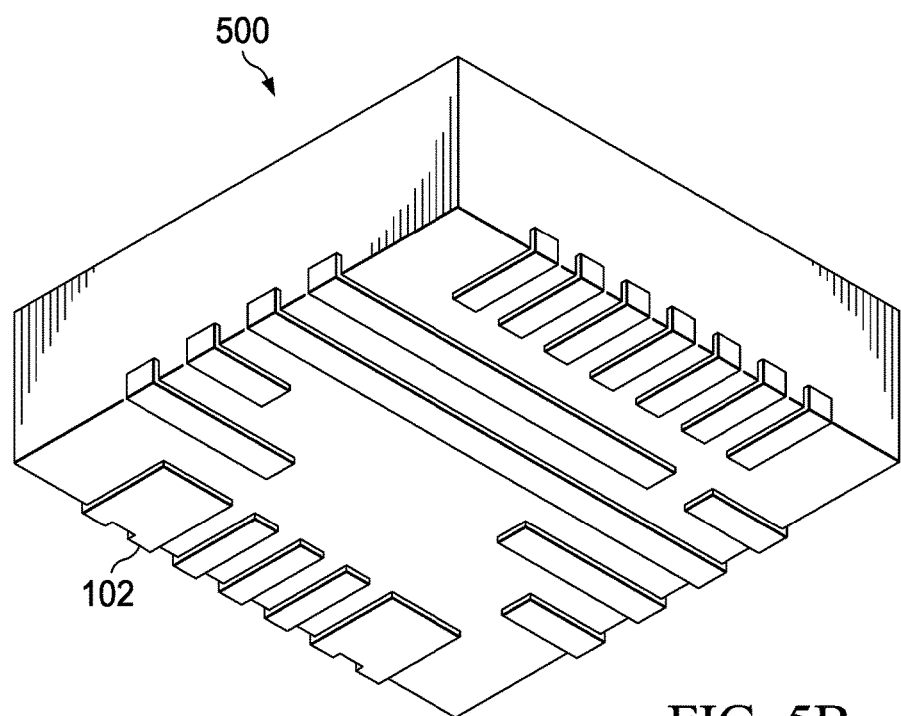

FIG. 5 illustrates an example integrated circuit package 500. Any of the devices 100, 200, 300, and 400 may be molded in a case, for example plastic, to form the integrated circuit package 500. Thus, the integrated circuit package 500 includes at least one inductor therein, such as disclosed herein. In this example, portions of the leadframe 102 outside of the integrated circuit package 500 have been cut-off evenly with the outer edges of the integrated circuit package 500.

Figure 6:
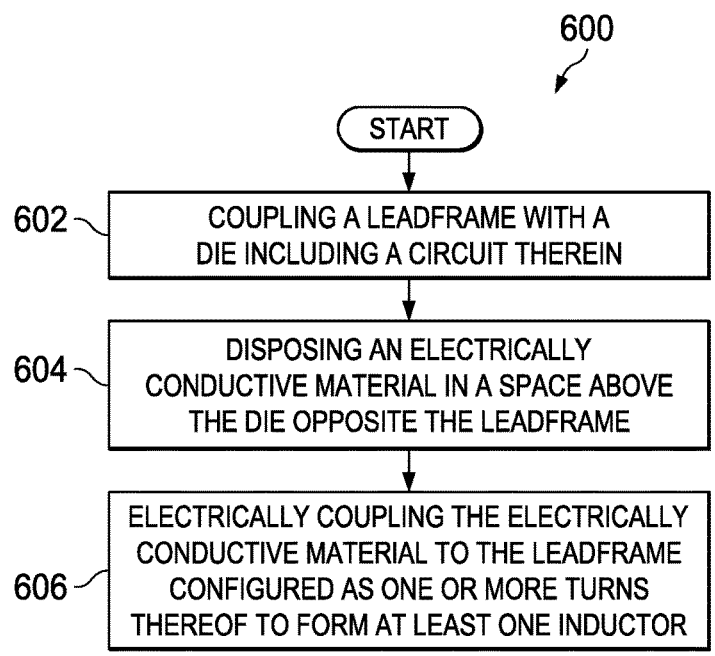
FIG. 6 illustrates an example method of forming an inductor.

In view of the foregoing structural and functional features described above, a method in accordance with various aspects of the present disclosure will be better appreciated with reference to FIG. 6. While, for purposes of simplicity of explanation, the method of FIG. 6 is shown and described as executing serially, it is to be understood and appreciated that the present disclosure is not limited by the illustrated order, as some aspects may, in accordance with the present disclosure, occur in different orders and/or concurrently with other aspects from that shown and described herein. Moreover, not all illustrated features may be required to implement a method in accordance with an aspect of the present disclosure.

FIG. 6 illustrates an example method 600 of forming an inductor in a space above a die 104. At 602, a leadframe 102 is electrically coupled to the die 104 that includes a circuit therein. As discussed above, the die 104 may be flip-chip attached to the leadframe 102, for example. In another example, the die 104 is fixed to the leadframe 102 using an adhesive. At 604, an electrically conductive material is disposed in a space above the die 104 opposite the leadframe 102. As discussed above, one or more winding members 108 of the inductor are comprised of the electrically conductive material, such as copper. In an example, a magnetic core 106 may be disposed between the one or more conductive winding members 108 and the die 104 to increase an inductance of the electrically conductive material.

At 606, the electrically conductive material, for example the winding member 108, is electrically coupled to the leadframe 102 to provide one or more turns thereof to form at least one inductor. For example, the electrically conductive winding member may include one or more connectors coupled to a lead 114 of the leadframe 102. In another example, a plurality of winding members 108 may wrap around a magnetic core 106 to form at least one inductor.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. A device, comprising:
    a die including a circuit therein;
    a first leadframe connected to the die, the first leadframe having a plurality of leads on outer edges thereof; and
    a second leadframe in a form of an electrically conductive clip at least partially encompassing the die, the die being positioned between the first and second leadframes, the second leadframe having one or more turns that form at least one inductor, and the second leadframe being connected to the first leadframe to electrically couple the at least one inductor with the circuit.

2. The device of claim 1, further comprising a layer of magnetic material between the die and the electrically conductive clip.

3. The device of claim 2, wherein the magnetic material is at least one of a ferrite plate, pressed metal powder, and a magnetic powder in an insulating binder.

4. The device of claim 3, wherein the insulating binder is at least one of epoxy, resin, and plastic.

5. The device of claim 1, wherein the electrically conductive clip includes a first winding member and a second winding member that are connected together as one or more of the turns that form the at least one inductor.

6. The device of claim 2, wherein the magnetic material is a first magnetic material, and the device further comprises a second magnetic material, at least a portion of the electrically conductive clip being positioned between the second magnetic material and the first magnetic material.

7. The device of claim 1, further comprising a package that encapsulates the die and the first and second leadframes.

8. A method, comprising:
    connecting a first leadframe to a die, the die including a circuit therein, and the first leadframe having a plurality of leads on outer edges thereof;
    disposing a second leadframe in a form of an electrically conductive clip at least partially encompassing the die, the die being positioned between the first and second leadframes, and the second leadframe having one or more turns that form at least one inductor; and
    connecting the second leadframe to the first leadframe to electrically couple the at least one inductor with the circuit.

9. The method of claim 8, further comprising depositing a layer of magnetic material between the die and the electrically conductive clip.

10. The method of claim 9, wherein the magnetic material is at least one of a ferrite plate, pressed metal powder, and a magnetic powder in an insulating binder.

11. The method of claim 10, wherein the insulating binder is at least one of epoxy, resin, and plastic.

12. The method of claim 8, wherein the electrically conductive clip includes a first winding member and a second winding member, and the method further comprises: connecting the first winding member and the second winding member together as one or more of the turns that form the at least one inductor.

13. The method of claim 8, wherein connecting the second leadframe to the first leadframe comprises connecting the electrically conductive clip to the first leadframe via at least one connector that is deflected to form one or more of the turns that form the at least one inductor.

14. The method of claim 8, further comprising overmolding the die and the first and second leadframes.

15. The device of claim 2, wherein the electrically conductive clip includes a first winding member and a second winding member that are connected together as one or more of the turns that form the at least one inductor.

16. The device of claim 1, wherein the electrically conductive clip is connected to the first leadframe via at least one connector that is deflected to form one or more of the turns that form the at least one inductor.

17. The method of claim 9, wherein the magnetic material is a first magnetic material, and the method further comprises depositing a second magnetic material, at least a portion of the electrically conductive clip being positioned between the second magnetic material and the first magnetic material.

18. A device, comprising:
    a die;
    a first leadframe connected to the die, the first leadframe having a plurality of leads on outer edges thereof;
    a second leadframe in a form of an electrically conductive clip at least partially encompassing the die, the die being positioned between the first and second leadframes, the second leadframe having one or more turns that form at least one inductor, and the second leadframe being connected to the first leadframe to electrically couple the at least one inductor with the circuit;
    a magnetic core having portions on the second leadframe; and
    a third leadframe having portions on the magnetic core, the third leadframe including a first winding member and a second winding member having portions shaped as clips, an end of the clip of the first winding member attached and electrically coupled to the first leadframe, and an end of the clip of the second winding member attached and electrically coupled to a portion of the second leadframe that extends beyond a periphery of the die.

19. The device of claim 18, wherein the end of the clip of the first winding member and the end of the clip of the second winding member deflect towards a plane along a surface of the first leadframe.

* * * * *